United States Patent
Jeon et al.

(10) Patent No.: US 8,199,821 B2
(45) Date of Patent: Jun. 12, 2012

(54) METHOD FOR MODELING CODING INFORMATION OF VIDEO SIGNAL FOR COMPRESSING/DECOMPRESSING CODING INFORMATION

(75) Inventors: Byeong Moon Jeon, Seol (KR); Doe Hyun Yoon, Seoul (KR); Ji Ho Park, Seoul (KR); Seung Wook Park, Seoul (KR)

(73) Assignee: LG Electronics Inc., Seoul (KR)

( * ) Notice: Subject to any disclaimer, the term of this patent is extended or adjusted under 35 U.S.C. 154(b) by 296 days.

(21) Appl. No.: 12/654,847

(22) Filed: Jan. 6, 2010

(65) Prior Publication Data

US 2010/0183080 A1 Jul. 22, 2010

Related U.S. Application Data

(63) Continuation of application No. 11/988,384, filed as application No. PCT/KR2006/002699 on Jul. 10, 2006, now Pat. No. 7,894,523.

(60) Provisional application No. 60/697,353, filed on Jul. 8, 2005, provisional application No. 60/701,045, filed on Jul. 21, 2005.

(30) Foreign Application Priority Data

Sep. 5, 2005 (KR) .......................... 10-2005-0082195

(51) Int. Cl.
*H04B 1/66* (2006.01)

(52) U.S. Cl. ......... 375/240.12; 375/240.16; 375/240.15; 375/240.03; 375/240.05; 375/240.14; 375/240.26; 375/240.24; 382/238; 382/251; 382/236; 382/247; 382/239; 382/235

(58) Field of Classification Search ............. 375/240.12, 375/240.16, 240.15, 240.03, 240.05, 240.14, 375/240.26, 240.24; 382/238, 251, 236, 382/247, 239, 235
See application file for complete search history.

(56) References Cited

U.S. PATENT DOCUMENTS

| | | | |
|---|---|---|---|
| 6,510,177 B1 | 1/2003 | De Bonet et al. | |
| 7,072,394 B2 | 7/2006 | Huang et al. | |
| 7,253,831 B2 | 8/2007 | Gu | |
| 7,286,710 B2 * | 10/2007 | Marpe et al. | .................. 382/239 |
| 7,292,165 B2 | 11/2007 | Cha et al. | |
| 7,379,608 B2 | 5/2008 | Marpe et al. | |
| 2002/0021761 A1 | 2/2002 | Zhang et al. | |

(Continued)

FOREIGN PATENT DOCUMENTS

EP        1715693        10/2006

(Continued)

OTHER PUBLICATIONS

Choi et al, The report of CE 3 Improve coding efficiency of entropy coding, Apr. 2005, ISO/IEC JTC1/SC29/WG11 and ITU-T SG16 Q.6, JVT-0021, pp. 1-13.*

(Continued)

*Primary Examiner* — Shawn An

(74) *Attorney, Agent, or Firm* — Harness, Dickey & Pierce, P.L.C.

(57) ABSTRACT

A method for context-modeling coding information of a video signal for compressing or decompressing the coding information is provided. An initial value of a function for probability coding of coding information of a video signal of an enhanced layer is determined based on coding information of a video signal of a base layer.

8 Claims, 4 Drawing Sheets

U.S. PATENT DOCUMENTS

| | | | |
|---|---|---|---|
| 2002/0118742 | A1 | 8/2002 | Puri et al. |
| 2006/0126744 | A1* | 6/2006 | Peng et al. .............. 375/240.26 |
| 2006/0232447 | A1 | 10/2006 | Walker et al. |
| 2006/0233254 | A1* | 10/2006 | Lee et al. .............. 375/240.16 |

FOREIGN PATENT DOCUMENTS

| | | |
|---|---|---|
| KR | 10-2006-0038189 | 5/2006 |
| KR | 10-2006-0082199 | 7/2006 |
| KR | 2006-083100 | 7/2006 |
| RU | 2 128 405 C1 | 3/1999 |
| RU | 2 201 654 C2 | 3/2003 |
| WO | WO 92/16071 | 9/1992 |
| WO | WO 99/33273 | 7/1999 |
| WO | WO 03/017672 A2 | 2/2003 |
| WO | WO 2006/075901 | 7/2006 |

OTHER PUBLICATIONS

Choi et al, The Efficient Coding Technique using Inter-layer Prediction, Jan. 2005, ISO/IEC JTC1/SC29/WG11, XP 030040412, pp. 1-7.*

Japanese Office Action dated Aug. 12, 2010 in corresponding Japanese Application No. 2008-520193.

Woong Ii Choi, Byeungwoo Jeon: "The report of CE 3 Improve coding efficiency of entropy coding", Joint Video Team (JVT) of ISO/IEC MPEG & IT U-T VCEG (ISO/IEC JTC1/SC29/WG11 and ITU-T SG16 Q6) 15$^{th}$ Meeting: Busan, KR, Apr. 16-22, 2005 [JVT-0021].

Woong Ii Choi, "CE 3, Improve coding efficiency of entropy coding", Joint Video Team (JVT) of ISO/IEC MPEG & IT U-T VCEG (ISO/IEC JTC1/SC29/WG11 and ITU-T SG16 Q6) 15$^{th}$ Meeting, Busan, KR, Apr. 16-22, 2005 [JVT-0303].

Y. Bao et al., "Improvements to Fine Granularity Scalability for Low-Delay Applications", Joint Video Team (JVT) of ISO/IEC MPEG & ITU-T VCEG (ISO/IEC JTC1/SC29/WG11 and ITU-T SG16 Q.6), 15$^{th}$ Meeting: Busan, Koreaa, Apr. 18-22, 2005.

Notice of Allowance issued Feb. 5, 2009 by the Russian Patent Office in counterpart Russian Patent Application No. 2008104816/09 (with English language translation).

T. Wiegand et al., "Draft Text of Final Draft International Standard (FDIS) of Joint Video Specification (ITU-T Rec. H.264, ISO/IEC 14496-10 AVC)", pp. i-xiv, 1-245, Joint Video Team (JVT) of ISO/IEC MPEG & ITU-T VCEG (ISO/IEC JTC1/SC29/WG11 and ITU-T SG16 Q.6), 7$^{th}$ Meeting, Pattaya, Thailand, Mar. 7-14, 2003.

J. Reichel et al., "Joint Scalable Video Model (JSVM) 2.0 Reference Encoding Algorithm Description", pp. 1-32, Joint Video Tem (JVT) of ISO/IEC MPEG & ITU-T VCEG (ISO/IEC JTC1/SC29/WG11 and ITU-T SG16 Q.6), Buzan, Korea, Apr. 2005.

Notice of Allowance issued Dec. 26, 2008 by the Korean Patent Office in counterpart Korean Patent Application No. 10-2008-7003053.

Office Action issued Nov. 13, 2008 by the Russian Patent Office in counterpart Russian Patent Application No. 2008104816/09 (with English language translation).

W. Peng, C. Wang, T. Chiang and H. Hang, "Context-Based Binary Arithmetic Coding with Stochastic Bit Reshuffling for Advanced Fine Granuality Scalability," Proc. of the 2004 Int'l. Symposium on Circuits and Systems (ISCAS'04), vol. 3, pp. III-953-8, May 23-26, 2004.

J. Han, X. Sun, F. Wu, S. Li and Z. Lu, "Variable Block-Size Transform and Entropy Coding at the Enhancement Layer of FGS," Proc. of Int'l Conf. Image Processing (ICIP '04), vol. 1, pp. 481-484, Oct. 24-27, 2004.

International Search Report issued Oct. 30, 2006 in counterpart International Patent Application No. PCT/KR2006/002703.

D. Marpe, H. Schwarz, T. Wiegand, "Context-based Adaptive Binary Arithmetic Coding in the H.264/AVC Video Compression Standard," IEEE Trans. Circuits Syst. for Video Tech., vol. 13, No. 7, pp. 620-636, Jul. 2003 ISO/IEC JTC1/SC29/WG11, "Text of ISO/IEC 14496-10 FDIS Advanced Video Coding," MPEG Document N5555, Pattaya, Mar. 2003.

International Search Report issued Oct. 19, 2006 in counterpart International Patent Application No. PCT/KR2006/002699 Written Opinion of the International Searching Authority issued Oct. 19, 2006 in counterpart International Patent Application No. PCT/KR2006/002699.

U.S. Office Action for corresponding U.S. Appl. No. 11/988,385 dated Jun. 4, 2010.

European Search Report dated Mar. 29, 2010 for corresponding Application No. 06757769.2.

Choi W et al: "SVC CE3 Improved entropy coding efficiency" Joint Video Team (JVT) of ISO/IEC MPEG & ITU-T VCEG (ISO/IEC JTC1/SC29/WG11 and ITU-T SG16 Q6), No. JVT-0021r1, Apr. 21, 2005, XP030005969.

Woong Il Choi et al: "The efficient coding technique using inter-layer prediction" Joint Video Team (JVT) of ISO/IEC MPEG & ITU-T VCEG (ISO/IEC JTC1/SC29/WG11 and ITU-T SG16 Q6), No. M11667, Jan. 17, 2005, XP030040412.

JVT: "Core experiment 3: Coding efficiency improvement of entropy coding" Joint Video Team (JVT) of ISO/IEC MPEG & ITU-T VCEG (ISO/IEC JTC1/SC29/WG11 and ITU-T SG16 Q6), No. JVT-O303, Apr. 22, 2005, XP030006031.

Jungong Han et al: "Variable block-size transform and entropy coding at the enhancement layer of FGS", International Conference on Image Processing, vol. 1, Oct. 24, 2004, XP010784859.

U.S. Office Action dated Nov. 28, 2011 issued in corresponding U.S. Appl. No. 11/988,385.

U.S. Office Action dated Jan. 13, 2012 issued in corresponding U.S. Appl. No. 12/805,322.

USPTO Office Action dated Dec. 18, 2009 for corresponding U.S. Appl. No. 11/988,385.

D. Marpe, H. Schwarz, T. Wiegand, "Context-based Adaptive Binary Arithmetic Coding in the H.264/AVC Video Compression Standard," IEEE Trans. Circuits Syst. for Video Tech., vol. 13, No. 7, pp. 620-636, Jul. 2003.

ISO/IEC JTC1/SC29/WG11, "Text of ISO/IEC 14496-10 FDIS Advanced Video Coding," MPEG Document N5555, Pattaya, Mar. 2003.

International Search Report issued Oct. 19, 2006 in counterpart International Patent Application No. PCT/KR2006/002699.

Written Opinion of the International Searching Authority issued Oct. 19, 2006 in counterpart International Patent Application No. PCT/KR2006/002699.

Korean Notice of Allowance dated Mar. 2, 2012 issued in corresponding Korean Application No. 10-2008-7027524 with English translation thereof.

* cited by examiner

| mb_type | bin string |
|---------|------------|
| Intra | 0 |
| P_8x8 | 100 |
| P_8x16 | 101 |
| P_16x8 | 110000 |
| P_16x16 | 110001 |
| Direct | 110010 |

FIG. 4

```
preCtxState = Clip3( 1, 126, ( ( m * SliceQPY ) >> 4 ) + n )
if( preCtxState <= 63 ) {
    pStateIdx = 63 - preCtxState
    valMPS = 0
} else {
    pStateIdx = preCtxState - 64
    valMPS = 1
}
```

METHOD FOR MODELING CODING INFORMATION OF VIDEO SIGNAL FOR COMPRESSING/DECOMPRESSING CODING INFORMATION

CROSS-REFERENCE TO RELATED APPLICATIONS

This application is a continuation of U.S. patent application Ser. No. 11/988,384 filed on Jan. 7, 2008, which is a national stage of PCT/KR2006/002699, filed on Jul. 10, 2006, which claims priority to Korean Application No. 10-2005-0082195, filed on Sep. 5, 2005, which claims benefit of U.S. Application No. 60/697,353, filed on Jul. 8, 2005 and U.S. Application No. 60/701,045, filed on Jul. 21, 2005. The disclosure(s) of the above application(s) is (are) incorporated herein by reference.

TECHNICAL FIELD

The present invention relates to a method for modeling coding information of a video signal in order to compress the coding information or decompress the compressed information.

BACKGROUND ART

Scalable Video Codec (SVC) encodes video into a sequence of pictures with the highest image quality while ensuring that part of the encoded picture sequence (specifically, a partial sequence of frames intermittently selected from the total sequence of frames) can be decoded and used to represent the video with a low image quality.

Although it is possible to represent low image-quality video by receiving and processing part of a sequence of pictures encoded according to a scalable scheme, there is still a problem in that the image quality is significantly reduced if the bitrate is lowered. One solution to this problem is to provide an auxiliary picture sequence for low bitrates, for example, a sequence of pictures that have a small screen size and/or a low frame rate.

The auxiliary picture sequence is referred to as a base layer, and the main frame sequence is referred to as an enhanced or enhancement layer. When the base layer is provided, inter-layer prediction is performed to increase coding efficiency.

The SVC, which is a codec extended from Advanced Video Codec (AVC) (also referred to as 'H.264'), can use Context-Adaptive Binary Arithmetic Coding (CABAC) for data compression. The CABAC is an entropy coding scheme which has been suggested for use in compression of a video signal coded in AVC.

The CABAC performs modeling for arithmetic coding of coding information of a macroblock, which is a specific syntax element, simply using corresponding coding information of an adjacent macroblock in the same layer. Appropriate modeling of coding information according to the probabilities of values of the coding information increases the compression rate of arithmetic coding.

However, the CABAC has not defined a standard for modeling coding information using information of a plurality of layers. Thus, when SVC providing a plurality of layers is employed, the CABAC cannot provide suitable modeling for coding information having a correlation between the plurality of layers.

DISCLOSURE OF INVENTION

The present invention has been made in view of the above problems, and it is an object of the present invention to provide a method for modeling coding information having a correlation between a plurality of layers in order to increase data compression rate.

In accordance with the present invention, the above and other objects can be accomplished by the provision of a modeling method, wherein an initial value of a function for probability coding of coding information of an image block in a first layer is determined based on coding information of a second layer different from the first layer.

In an embodiment of the present invention, flags, which can be used for determining the initial value of the function for probability coding of the coding information, include a flag "base_mode_flag" indicating whether or not image data coded in an intra mode or motion vector information of a block in the second layer corresponding to the image block is to be used for the image block, a flag "base_mode_refinement_flag" indicating whether or not refinement is necessary for the image block to use motion vector information of a block in the second layer corresponding to the image block, a flag "residual_prediction_flag" indicating whether or not residual data of the image block has been coded using data predicted from residual data of a block in the second layer corresponding to the image block, a flag "intra_base_flag" indicating whether or not image data of the image block has been coded into difference data based on image data of an intra mode block in the second layer corresponding to the image block, a flag "mvd_ref_1X" indicating a refinement value required to obtain a motion vector of the image block using motion vector information of a block in the second layer corresponding to the image block, and a flag "motion_prediction_flag_1X" indicating whether or not a motion vector of a block in the second layer corresponding to the image block is to be used for a predictive motion vector of the image block.

In another embodiment of the present invention, coding information, corresponding to the coding information of the image block, of a block in the second layer corresponding to the image block is used as the coding information of the second layer.

In another embodiment of the present invention, information indicating whether a block in the second layer corresponding to the image block has been coded in an inter mode or in an intra mode is used as the coding information of the second layer.

In another embodiment of the present invention, the initial value is determined based on whether or not partition information of a block in the second layer corresponding to the image block is identical to partition information of the image block.

In another embodiment of the present invention, the initial value is determined based on a quantization parameter value of a block in the second layer corresponding to the image block or based on the difference between the quantization parameter value and a quantization parameter value of the image block.

In another embodiment of the present invention, the initial value is determined based on the difference between a motion vector of the image block and a motion vector of a block in the second layer corresponding to the image block.

In another embodiment of the present invention, the initial value is determined based on whether or not a value indicating a reference picture of the image block is identical to a value indicating a reference picture of a block in the second layer corresponding to the image block.

In another embodiment of the present invention, the initial value is determined based on whether or not spatial resolution of the image block is identical to spatial resolution of a block in the second layer corresponding to the image block.

In another embodiment of the present invention, the initial value is determined based on block pattern information indicating whether or not a value other than 0 is present in a block in the second layer corresponding to the image block.

In another embodiment of the present invention, in order to determine the initial value, two constants "m" and "n" are selected based on the coding information of the second layer, an intermediate value is determined based on the selected constants "m" and "n" and information associated with coding of the second layer (for example, a quantization parameter value of the second layer, the difference between quantization parameter values of the first and second layers, or a spatial resolution ratio between the first and second layers), and an initial probability value and an MPS of the coding information are determined based on whether or not the intermediate value is greater than a predetermined value.

BRIEF DESCRIPTION OF DRAWINGS

The above and other objects, features and other advantages of the present invention will be more clearly understood from the following detailed description taken in conjunction with the accompanying drawings, in which:

FIG. 4 illustrates a routine for determining an initial value for probability coding.

MODES FOR CARRYING OUT THE INVENTION

The embodiments of the present invention will now be described in detail with reference to the accompanying drawings.

Figure 1:
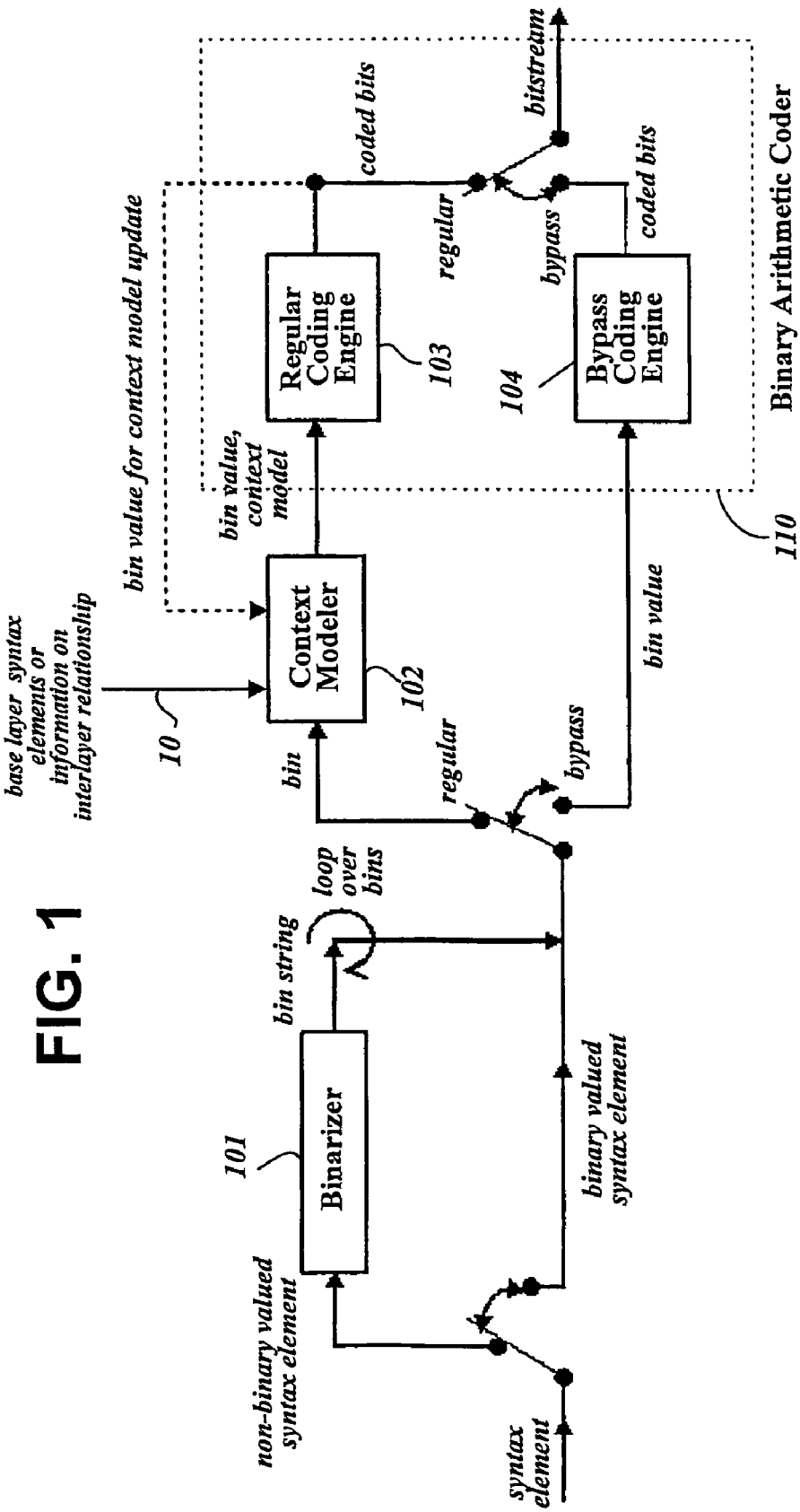
FIG. 1 is a block diagram of a CABAC executer of an enhanced layer encoder, which performs context modeling according to the present invention.

FIG. 1 is a block diagram of a CABAC executer of the enhanced layer according to a preferred embodiment of the present invention. The CABAC executer shown in FIG. 1 includes a binarizer 101, a context modeler 102, and an arithmetic coder 110. The binarizer 101 binarizes input non-binary valued coding information according to a specified scheme. Specifically, the binarizer 101 converts a non-binary valued syntax element into a bin string as illustrated in FIG. 1. The context modeler 102 models each bit of binary valued coding information based not only on coding information in an adjacent block in the same layer (in the enhanced layer in this example) but also on base layer coding information correlated with the binary valued coding information or inter-layer relationship information 10. The arithmetic coder 110 performs arithmetic coding on an input bit based on a set model.

The arithmetic coder 110 includes a regular coding engine 103 for performing arithmetic coding on bits of the coding information based on variables (specifically, probability functions and initial values of the probability functions) modeled by the context modeler 102, and a bypass coding engine 104 for performing arithmetic coding on coding information which does not benefit from modeling since bits 0 and 1 of the coding information have almost the same probability of occurrence.

The present invention, which involves modeling of input coding information, is not directly related to the arithmetic coding procedure based on the modeled variables. Thus, a description of bit compression (entropy coding) associated with the arithmetic coder 110 is omitted herein since it is not necessary for understanding the present invention.

Figures 2, 3:
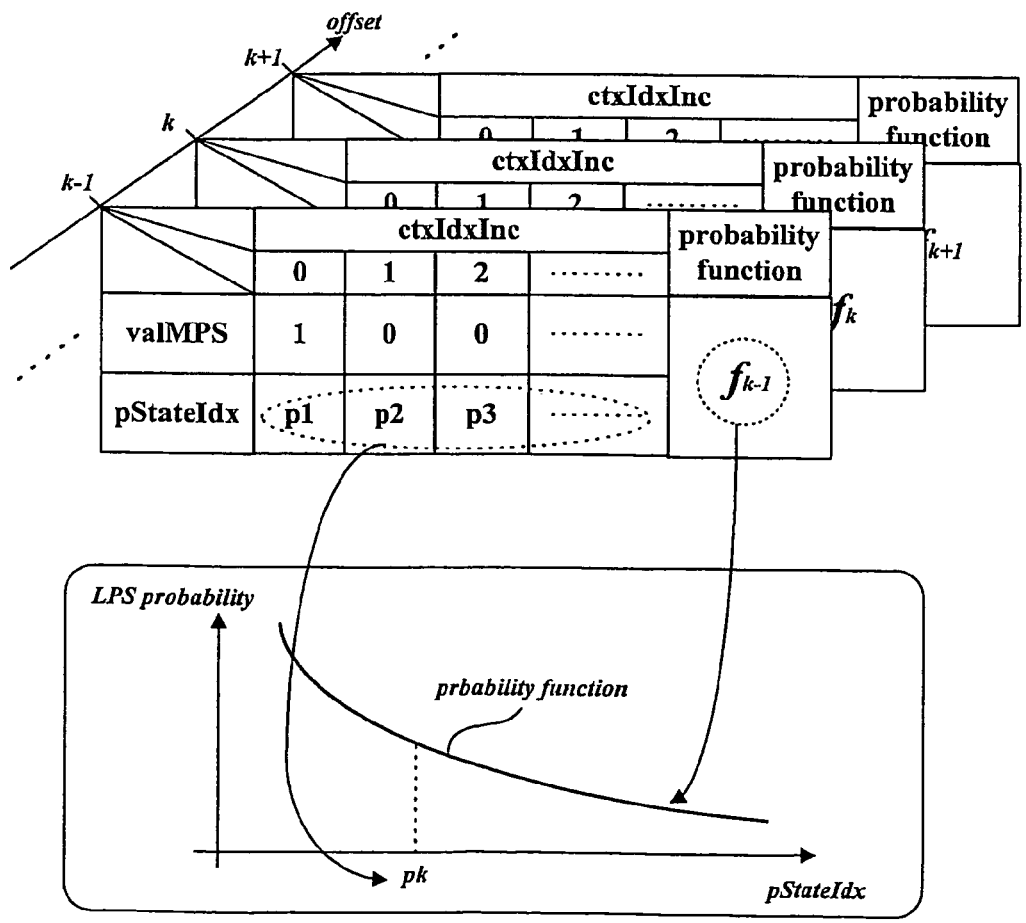
FIG. 2 illustrates an example of binarization of input coding information.
FIG. 3 illustrates a context modeling method for probability coding of coding information.

When the input coding information has a non-binary value, the CABAC executer of FIG. 1 binarizes the value of the input coding information through the binarizer 101. FIG. 2 illustrates an example of the binarization. Coding information used in the example of FIG. 2 is associated with macroblock types (mb_type). The macroblock types (Direct, Intra, P_16×16, P_16×8, P_8×16, and P_8×8) are assigned respective binary values (or bin strings) according to a predetermined scheme (or transform table). Other coding information is binarized according to other schemes (or transform tables) specified for corresponding elements in a similar manner to that of FIG. 2.

For bit compression, bits obtained through the above binarization are input to the arithmetic coder 110 provided subsequent to the binarizer 101. Bits of coding information, which have the same probability of occurrence of bit values 0 and 1, are directly input to the bypass coding engine 104, whereas bits of coding information, which have different probabilities of occurrence of bit values 0 and 1, are input to the context modeler 102 so that the input bits are subjected to a modeling process.

The context modeler 102 performs modeling of each bit of input coding information in the enhanced layer based on bit values of corresponding coding information of an adjacent macroblock and/or base layer coding information correlated with the coding information and a value of corresponding coding information received from a base layer encoder (not shown) or based on information 10 regarding the relationship between the enhanced layer and the base layer. Modeling is a process of selecting a probability function and determining an initial value of the probability function. As illustrated in FIG. 3, an offset value k−1, k, or k+1 is determined according to coding information so that a probability function $f_{k-1}$, $f_k$, or $f_{k+1}$ of the coding information is selected, and a value of an index variable "ctxIdxInc" is determined from the offset value according to information correlated with the coding information. The same probability function can be used for all of coding information. In other words, a single probability function can be used irrespective of coding information. As the value of the index variable "ctxIdxInc" is determined, initial values "valMPS" and "pStateIdx" for use with the probability function are determined. As the initial value "pStateIdx" is determined, an initial probability of the LPS (or MPS) is determined as illustrated in FIG. 3. Accordingly, the regular coding engine 103 provided subsequent to the context modeler 102 codes (or compresses) each bit of the input coding information using the selected probability function, starting from the determined initial values "valMPS" and "pStateIdx". Here, the pStateIdx is a probability state information and the valMPS is most probable value information for the probability function.

We now suggest detailed examples of a method for determining the value of the index variable "ctxIdxInc" when the context modeler 102 performs modeling. A variety of examples suggested below are simply examples of the method for modeling specific coding information of the enhanced layer based on coding information correlated with the value of the specific coding information or based on the relationship between the enhanced and base layers. Thus, the present invention is not limited to the examples suggested below, and any method, which is characterized by modeling coding information of the enhanced layer based on coding information correlated with an element value of the coding information or based on the relationship between the enhanced and base layers, falls within the scope of the present invention.

First, a description will be given of a variety of methods for determining an index variable "ctxIdxInc" of a flag "base_mode_flag", which indicates whether or not coding information (for example, motion vector information or intra-mode image data) of a block in the base layer corresponding to a macroblock is to be used for the macroblock.

$$\text{ctxIdxInc} = \text{condTermFlag}A + \text{condTermFlag}B + \text{condTermFlagBase} \quad (1\text{-}1).$$

Here, "A" and "B" denote adjacent macroblocks located on the upper and left sides of a current macroblock X. A flag "condTermFlagN" (N=A or B) has a value of "0" if a macroblock N is not available or if a flag "base_mode_flag" of the macroblock N is 0, otherwise it has a value of "1". Similarly, a flag "condTermFlagBase" has a value of "0" if a block in the base layer corresponding to the current macroblock X is not present or if a flag "base_mode_flag" of the corresponding block is 0, otherwise it has a value of "1". That is, a value of corresponding coding information of the base layer is also used as a basis for determining a value of the index variable "ctxIdxInc". This indicates that an initial value for probability coding varies depending on the value of the corresponding coding information of the base layer.

$$\text{ctxIdxInc} = \text{condTermFlag}A' + \text{condTermFlag}B' + \text{condTermFlagBase}' \quad (1\text{-}2).$$

Here, a flag "conTermFlag'" of a block is assigned a value of "0" or "1" depending on whether the block is in an inter mode or in an intra mode. For example, a flag "condtermFlagBase'" has a value of "0" (or "1") if a block in the base layer corresponding to the current macroblock X is in an inter mode, and has a value of "1" (or "0") if the corresponding block is in an intra mode.

In this method, the (inter or intra mode) modes of the two adjacent blocks A and B and the corresponding block in the base layer are used as a basis for determining the initial value of the probability function for coding the bit of the flag "base_mode_flag".

Alternatively, only the flag "condtermFlagBase'" (i.e., only the mode of the corresponding block in the base layer) may be used as a basis for determining the value of the index variable "ctxIdxInc" so that the initial value varies depending only on the value of the flag "condtermFlagBase'".

$$\text{ctxIdxInc} = (\text{BaseBlkSize} == \text{EnhanceBlkSize})?1:0 + \text{condTermFlag}A + \text{condTermFlag}B \quad (1\text{-}3).$$

In this method, a value indicating whether or not a partition of a block in the base layer is identical to that of a block in the enhanced layer (for example, a value of "1" when identical and a value of "0" when not identical) or a value indicating whether or not the size of a block in the base layer is equal to that of a corresponding block in the enhanced layer (for example, a value of "1" when equal and a value of "0" when not equal) is used as a basis for determining the initial value of the probability function.

$$\text{ctxIdxInc} = \text{condTermFlag}A'' + \text{condTermFlag}B'' + \text{condTermFlagBase}'' \quad (1\text{-}4).$$

Here, a flag "condTermFlag''" of a block is assigned a value of "1" if a quantization parameter of the block has a value equal to or greater than a predetermined threshold, otherwise it is assigned a value of "0". In this method, quantization parameters of the two adjacent blocks A and B and a quantization parameter of the corresponding block in the base layer are used as a basis for determining the initial value of the probability function for coding the bit of the flag "base_mode_flag".

The flag "condTermFlag'''" of a block can also be assigned a value of "1" or "0" depending on the difference between the value of a quantization parameter of the block and the value of a different quantization parameter, rather than depending on the quantization parameter of the block, so that the value of the index "ctxIdxInc" is determined based on the value of the flag "condTermFlag'''". For example, a flag "condTermFlagN'''" of a block N is assigned a value of "1" if the difference between the value of a quantization parameter of the block N and the value of a quantization parameter of a block in the base layer corresponding to the block N is equal to or greater than a predetermined threshold, otherwise the flag "condTermFlagN'''" is assigned a value of "0". In this example, "condTermFlagBase'''" denotes a flag indicating whether the difference between the value of a quantization parameter of the current block X and the value of a quantization parameter of a block in the base layer corresponding to the current block X is greater or less than the predetermined threshold.

Alternatively, only the flag "condTermFlagBase'''" (i.e., only the value of the quantization parameter of the block in the base layer corresponding to the current block X (or only the difference between the value of the quantization parameter of the current block X and the value of the quantization parameter of the corresponding block)) may be used as a basis for determining the value of the index variable "ctxIdxInc" so that the initial value varies depending only on the value of the flag "condTermFlagBase'''".

$$\text{ctxIdxInc} = 0 \text{ (if } C \geq \text{threshold 1)},$$

$$1 \text{ (if threshold 1} > C \geq \text{threshold 2)},$$

$$2 \text{ (if } C < \text{threshold 2)} \quad (1\text{-}5).$$

Here, "C" denotes a motion vector of the corresponding block in the base layer or the difference between the motion vector of the corresponding block and a motion vector of one of the adjacent macroblocks or an average motion vector of the adjacent macroblocks.

That is, the motion vector of the base layer is used as a basis for determining the initial value of the probability function.

$$\text{ctxIdxInc} = (\text{refIdx}_{Enhance}L1 == \text{refIDx}_{Base}L1)?1:0 + (\text{refIdx}_{Enhance}L0 == \text{refIdx}_{Base}L0)?1:0 \quad (1\text{-}6).$$

In this method, a value indicating whether or not indices of reference picture refIdxL0 and refIdxL1 in picture groups L0 and L1 of a macroblock having coding information, which is to be currently coded, are equal to indices of reference pictures in picture groups L0 and L1 of a corresponding block in the base layer (for example, a value of "2" when both the reference picture indices refIdxL0 and refIdxL1 in the picture groups L0 and L1 are equal to those of the base layer, a value of "1" when one of the reference picture indices refIdxL0 and refIdxL1 is equal to a corresponding one of the base layer, and a value of "0" when none of the reference picture indices refIdxL0 and refIdxL1 is equal to those of the base layer) is used as a basis for determining the initial value of the probability function, so that the initial value varies depending on the value indicating whether or not the reference picture indices in the enhanced layer are equal to those in the base layer.

A combination of the above methods (1-1 to 1-6), rather than one of the above methods, may be used to determine the initial value of the probability function for entropy coding of the flag "base_mode_flag".

Next, a description will be given of a variety of methods for determining an index variable "ctxIdxInc" of a flag "base_mode_refinement_flag" indicating whether or not refinement is necessary for a macroblock to use motion vector information of a block in the base layer corresponding to the macroblock.

Since the flag "base_mode_refinement_flag" is not used when a corresponding macroblock in the base layer has been coded in an intra mode, a method assuming the intra mode coding, for example, a method similar to the above method 1-2) are not used for modeling of the bit of the flag "base_mode_refinement_flag".

$$\text{ctxIdxInc}=\text{condTermFlag}A+\text{condTermFlag}B+\text{cond-TermFlagBase} \qquad (2\text{-}1).$$

A flag "condTermFlagN" (N=A or B) has a value of "0" if a macroblock N is not available or if a flag "base_mode_refinement_flag" of the macroblock N is 0, otherwise it has a value of "1". Similarly, a flag "condTermFlagBase" has a value of "0" if a block in the base layer corresponding to the current macroblock is not present or if a flag "base_mode_refinement_flag" of the corresponding block is 0, otherwise it has a value of "1". That is, a value of corresponding coding information of the base layer is used as a basis for determining a value of the index variable "ctxIdxInc".

$$\text{ctxIdxInc}=(\text{BaseBlkSize}==\text{EnhanceBlkSize})?1:0+\text{condTermFlag}A+\text{condTermFlag}B \qquad (2\text{-}2).$$

This method is similar to the above method 1-3).

$$\text{ctxIdxInc}=\text{condTermFlag}A''+\text{condTermFlag}B''+\text{condTermFlagBase}'' \text{ or}$$
$$\text{ctxIdxInc}=\text{condTermFlagBase}'' \qquad (2\text{-}3).$$

This method is similar to the above method 1-4).

$$\text{ctxIdxInc}=(\text{SpatialRes}_{Enhance}==\text{SpatialRes}_{Base})?1:0 \qquad (2\text{-}4).$$

In this method, a value indicating whether or not spatial resolution of a picture in the base layer is equal to that of a picture in the enhanced layer (for example, a value of "1" when equal and a value of "0" when not equal) is used as a basis for determining the initial value of the probability function.

A combination of the above methods (2-1 to 2-4), rather than one of the above methods, may be used to determine the initial value of the probability function for probability coding of the flag "base_mode_refinement_flag".

Next, a description will be given of a variety of methods for determining an index variable "ctxIdxInc" of a flag "residual_prediction_flag" indicating whether or not residual data of a macroblock has been coded using data predicted from residual data of a block in the base layer corresponding to the macroblock.

$$\text{ctxIdxInc}=\text{condTermFlag}A+\text{condTermFlag}B+\text{cond-TermFlagBase} \qquad (3\text{-}1).$$

A flag "condTermFlagN" (N=A or B) has a value of "0" if a macroblock N is not available or if a flag "residual_prediction_flag" of the macroblock N is 0, otherwise it has a value of "1". Similarly, a flag "condTermFlagBase" has a value of "0" if a block in the base layer corresponding to the current macroblock is not present or if a flag "residual_prediction_flag" of the corresponding block is 0, otherwise it has a value of "1". That is, a value of corresponding coding information of the base layer is used as a basis for determining a value of the index variable "ctxIdxInc".

$$\text{ctxIdxInc}=(\text{BaseBlkSize}==\text{EnhanceBlkSize})?1:0+\text{condTermFlag}A+\text{condTermFlag}B \qquad (3\text{-}2).$$

This method is similar to the above method 1-3).

$$\text{ctxIdxInc}=\text{condTermFlag}A''+\text{condTermFlag}B''+\text{condTermFlagBase}'' \text{ or}$$
$$\text{ctxIdxInc}=\text{condTermFlagBase}'' \qquad (3\text{-}3).$$

This method is similar to the above method 1-4).

$$\text{ctxIdxInc}=(\text{refIdx}_{Enhance}L1==\text{refIdx}_{Base}L1)?1:0+(\text{refIdx}_{Enhance}L0==\text{refIdx}_{Base}L0)?1:0 \qquad (3\text{-}4).$$

This method is similar to the above method 1-6).

ctxIdxInc=0 (if $C \geq$ threshold 1), 1 (if threshold 1 > $C \geq$ threshold 2), 2 (if $C$ < threshold 2) $\qquad (3\text{-}5).$ This method is similar to the above method 1-5).

$$\text{ctxIdxInc}=(\text{SpatialRes}_{Enhance}==\text{SpatialRes}_{Base})?1:0 \qquad (3\text{-}6).$$

This method is similar to the above method 2-4).

$$\text{ctxIdxInc}=\text{CBP}_{Base}?1:0 \qquad (3\text{-}7).$$

In this method, the initial value of the probability function for coding the flag "residual_prediction_flag" is determined from a value of a Coded Block Pattern (CBP) of a corresponding block in the base layer. Here, a CBP of a luminance block or a chrominance block of the base layer can be used as the CBP. The CBP of a block has a value other than "0" if any non-zero value is present in the block, otherwise it has a value of "0". In this method, the initial value of the probability function for coding the flag "residual_prediction_flag" is set differently depending on a value indicating whether or not a value other than "0" is present in the corresponding block in the base layer, which is "1" when any non-zero is present and "0" when a value other than "0" is not present.

This case is explained in more detail. In the event that resolution ratio between current layer and base layer is 2:1, the size of a block on the base layer corresponding to a current 16×16 macroblock is 4×4. Therefore, a bit value associated with the 4×4 block in the CBP of a macroblock including the 4×4 block on the base layer is set to the index variable "ctxIdxInc" to determine initial value of a probability function because the bit value in the CBP indicates whether the 4×4 block has any non-zero value.

Further, if a macroblock 'BL1_MB' on the base layer including the 4×4 block is coded in residual prediction manner based on a corresponding block 'BL2_B' on a lower layer (the second base layer), that is, if "residual_prediction_flag" of the macroblock 'BL1_MB' on the base layer is set to "1", value of the index variable "ctxIdxInc" is determined according to an associated CBP bit of the corresponding block 'BL2_B' on the second base layer.

In the method of using the CBP for determining the initial value, the values of corresponding coding information "residual_prediction_flag" of adjacent blocks A and B, in addition to the above condition ($\text{CBP}_{Base}$?1:0), can be used as conditions for determining the index variable "ctxIdxInc". In this case, the index variable "ctxIdxInc" can be determined as follows:

$$\text{ctxIdxInc}=\text{CBPBase}?1:0+\text{condTermFlag}A+\text{condTermFlag}B$$

Alternatively, the index variable "ctxIdxInc" may be determined based on the CBP values of the two adjacent blocks A and B as follows:

$$\text{ctxIdxInc}=\text{CBP}_A?1:0+\text{CBP}_B?1:0$$

A combination of the above methods (3-1 to 3-7), rather than one of the above methods, may be used to determine the initial value of the probability function for probability coding of the flag "residual_prediction_flag".

Modeling (for example, initial value setting) of coding information other than the coding information described above can also be performed in different manners, according to coding information of the base layer or according to an interlayer relationship.

For example, modeling for probability coding of a flag "intra_base_flag" indicating whether or not image data of an enhanced layer block has been coded into difference data based on image data of an intra mode block in the base layer corresponding to the enhanced layer block can also be performed in different manners, using an interlayer relationship (specifically, using corresponding coding information in the base layer) according to a similar method to that of 1-1), using an interlayer relationship of spatial resolution according to a similar method to that of 2-4), or using a quantization parameter representing the image quality level of the base layer according to a similar method to that of 1-4).

In addition, modeling for probability coding of information "mvd_ref_1X,X=0,1" indicating a refinement value required for a macroblock to use motion vector information of a block in the base layer corresponding to the macroblock can also be performed in different manners, using an interlayer relationship (specifically, using corresponding coding information in the base layer) according to a similar method to that of 1-1) or using an interlayer relationship of spatial resolution according to a similar method to that of 2-4).

Further, modeling for probability coding of a flag "motion_prediction_flag_1X,X=0,1" indicating whether or not a motion vector of a block of the base layer corresponding to a macroblock is to be used for a predictive motion vector of the macroblock can also be performed in different manners, using an interlayer relationship (specifically, using corresponding coding information in the base layer) according to a similar method to that of 1-1), using an interlayer relationship of spatial resolution according to a similar method to that of 2-4), or using a block size relationship according to a similar method to that of 1-3).

The variety of modeling methods described above can also be applied to any other coding information whose value may be affected by the interlayer relationship.

Although the above description has been given as if the initial values "valMPS" and "pStateIdx" are determined directly from the index variable "ctxIdxInc", the two initial values are determined from values "m" and "n" which are determined from the index variable "ctxIdxInc" as illustrated in FIG. 4.

An intermediate value "preCtxState" in the initial value determination routine of FIG. 4 is determined by a function "Clip3( )". The preCtxState determination function "Clip3( )" has a luminance quantization parameter "SliceQPY" as an argument (varX), in addition to the values "m" and "n". This argument (varX) is associated with a macroblock having coding information which is to be currently coded. The argument (varX), which has an influence on the initial value determination in addition to the values "m" and "n", has no value associated with the interlayer relationship.

Accordingly, if the interlayer relationship is reflected in the argument (varX) so that an initial value based on the interlayer relationship is obtained, the initial value is likely to have a value which is much more advantageous in terms of probability coding. Thus, according to the present invention, the interlayer relationship is reflected in the argument (varX).

Methods for reflecting the interlayer relationship in the argument (varX) are to use a luminance quantization parameter "BaseSliceQPY" of the base layer as the argument (varX), to use the difference between quantization parameters of the enhanced and base layers as the argument (varX), or to use the spatial resolution ratio between the base layer and the current layer as the argument (varX).

When the difference between the quantization parameters of the enhanced and base layers is used as the argument (varX), the preCtxState determination function 401 of FIG. 4 can be defined as follows according to the present invention:

preCtxState=Clip3(1,126,((m*
(SliceQPYBaseSliceQPY))>>4)+n)

Figure 5:
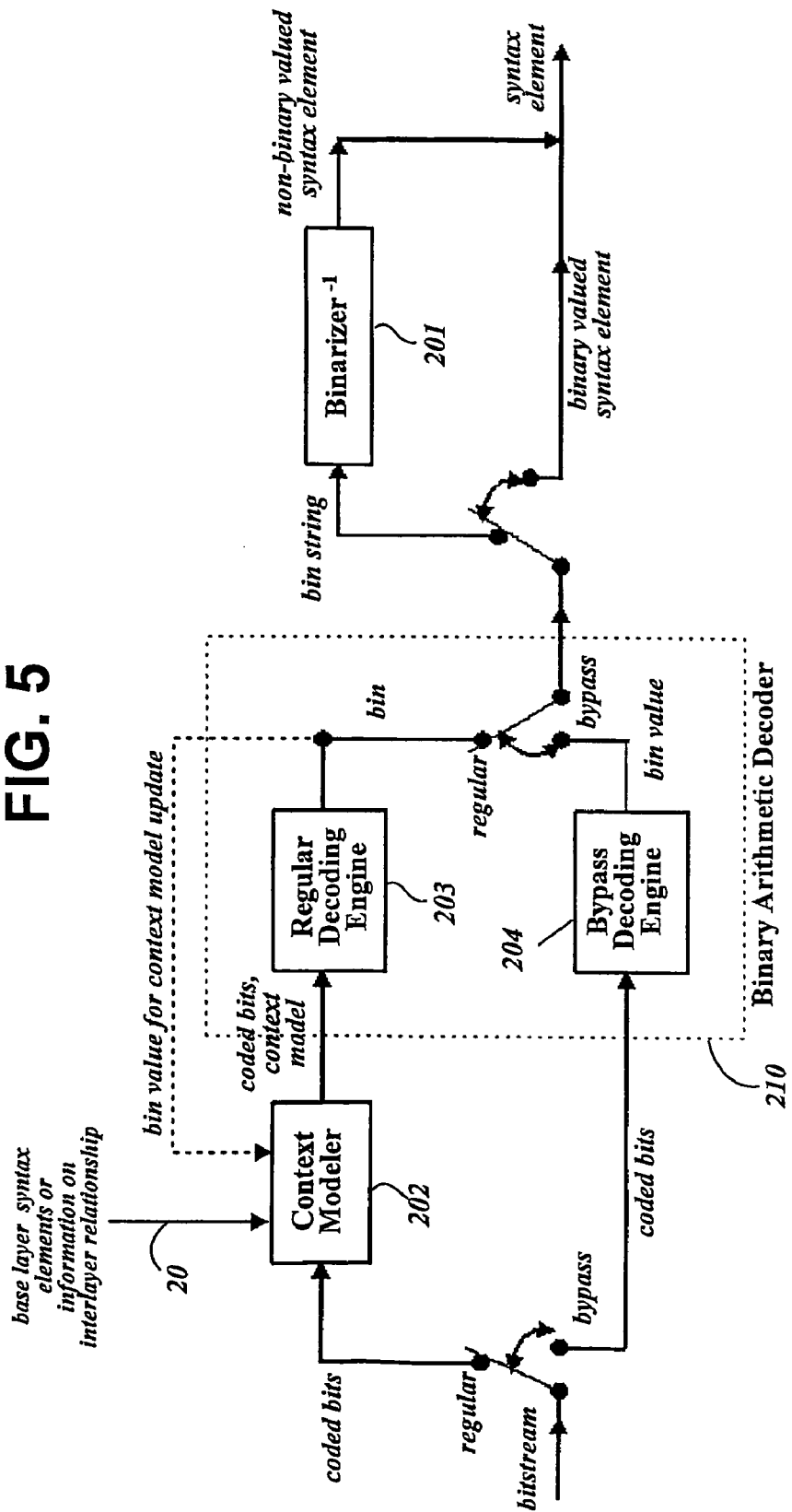
FIG. 5 is a block diagram of a CABAC executer of an enhanced layer decoder, which performs context modeling according to the present invention.

Although the above method has been described for probability coding in the encoder, the same method is applied to a CABAC decoder of FIG. 5 for decompressing compressed data, and a description of context modeling in the decoder is omitted herein.

In a similar manner to the method whereby the context modeler 102 in the CABAC coder of FIG. 1 models target coding information, a context modeler 202 in the CABAC decoder of FIG. 5 models target coding information based on base layer coding information and interlayer relationship information 20 and passes a corresponding initial value to a regular decoding engine 203 provided subsequent to the context modeler 202. The regular decoding engine 203 converts bits of input coding information into a decompressed bit string, starting from the same value as the initial value employed in the regular coding engine 103 in the encoder.

The decoder, which includes the context modeler for modeling coding information according to the method described above, can be incorporated into a mobile communication terminal, a media player, or the like.

As is apparent from the above description, a method for modeling coding information of a video signal for compressing and decompressing the coding information according to the present invention performs context modeling of each bit of the coding information using an interlayer correlation, so that an initial value of a function for probability coding of the coding information, which is advantageous in terms of probability coding, (i.e., an initial value which further reduces the initial probability of the LPS), is determined, thereby significantly increasing the data compression rate of probability coding.

Although this invention has been described with reference to the preferred embodiments, it will be apparent to those skilled in the art that various improvements, modifications, replacements, and additions can be made in the invention without departing from the scope and spirit of the invention. Thus, it is intended that the invention cover the improvements, modifications, replacements, and additions of the invention, provided they come within the scope of the appended claims and their equivalents.

The invention claimed is:

1. A method for performing a modeling of coding information, comprising:
receiving a video signal including a bitstream of an enhanced layer and a bitstream of a base layer;
deriving quantization parameter information associated with a slice including a current macroblock from the bitstream of the enhanced layer;
obtaining an intermediate variable using the quantization parameter information, the intermediate variable indicating a variable being used for an initial process of context modeling;

determining an initial value of a function for probability coding based on the intermediate variable; and performing a modeling of coding information of the current macroblock using the initial value, wherein the coding information indicates whether a residual data of the current macroblock in the enhanced layer is predicted from a corresponding block in the base layer.

2. The method of claim 1, wherein the enhanced layer is distinguished from the base layer by at least one of an image quality or a spatial resolution and the image quality is based on a quantization step size.

3. The method of claim 2, wherein the base layer has a lower image quality than the enhanced layer.

4. The method of claim 1, wherein the initial value of the function for probability coding includes at least one of pStateIdx and valMPS, the pStateIdx representing probability state information and the valMPS representing most probable value information.

5. An apparatus for performing a modeling of coding information, comprising:

a context modeler receiving a video signal including a bitstream of an enhanced layer and a bitstream of a base layer, deriving quantization parameter information associated with a slice including a current macroblock from the bitstream of the enhanced layer, obtaining an intermediate variable using quantization parameter information, determining an initial value of a function for probability coding based on the intermediate variable, and performing a modeling of coding information of the current macroblock using the initial value, wherein the intermediate variable indicates a variable being used for an initial process of context modeling, and the coding information indicates whether a residual data of the current macroblock in the enhanced layer is predicted from a corresponding block in the base layer.

6. The apparatus of claim 5, wherein the enhanced layer is distinguished from the base layer by at least one of an image quality or a spatial resolution and the image quality is based on a quantization step size.

7. The apparatus of claim 6, wherein the base layer has a lower image quality than the enhanced layer.

8. The apparatus of claim 5, wherein the initial value of the function for probability coding includes at least one of pStateIdx and valMPS, the pStateIdx representing probability state information and the valMPS representing most probable value information.

* * * * *